United States Patent
Sakaguchi et al.

(10) Patent No.: US 6,540,861 B2
(45) Date of Patent: *Apr. 1, 2003

(54) MEMBER SEPARATING APPARATUS AND PROCESSING APPARATUS

(75) Inventors: Kiyofumi Sakaguchi, Yokohama; Takao Yonehara, Atsugi; Kazuaki Omi; Kazutaka Yanagita, both of Yokohama; Toshikazu Miyakogawa, Ebina, all of (JP)

(73) Assignee: Canon Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/275,305

(22) Filed: Mar. 24, 1999

(65) Prior Publication Data

US 2001/0001975 A1 May 31, 2001

(30) Foreign Application Priority Data

Apr. 1, 1998 (JP) .......................... 10-088970
Apr. 1, 1998 (JP) .......................... 10-088971

(51) Int. Cl.[7] .......................... B32B 31/00; B32B 35/00
(52) U.S. Cl. .................. 156/239; 156/344; 156/529; 156/584; 83/177; 438/458
(58) Field of Search .................. 156/239, 344, 156/529, 584; 83/177; 29/426.4, 426.5, 762; 438/455, 458

(56) References Cited

U.S. PATENT DOCUMENTS

| | | | |
|---|---|---|---|
| 4,686,877 A | * | 8/1987 | Jaritz et al. .................. 83/177 |
| 4,962,879 A | | 10/1990 | Goesele et al. |
| 5,213,451 A | * | 5/1993 | Frank et al. .................. 406/72 |

(List continued on next page.)

FOREIGN PATENT DOCUMENTS

| | | |
|---|---|---|
| EP | 0383391 A1 | 8/1990 |
| EP | 0767486 A2 | 4/1997 |
| EP | 0793263 A2 | 9/1997 |
| EP | 0797258 A2 | 9/1997 |
| EP | 0843345 A2 | 5/1998 |
| EP | 0867917 A2 | 9/1998 |

(List continued on next page.)

OTHER PUBLICATIONS

"History of Water Jet Machining Development", *Journal of the Water Jet Technology, Society of Japan*, 1–1, (Japanese) with Statement of Releavance.
U.S. Patent Appln. S.N. 09/047,327 "Method and Apparatus for Separating Composite Member Using Fluid" filed Mar. 25, 1998.
European Search Report dated Aug. 3, 2001.

*Primary Examiner*—Mark A. Osele
(74) *Attorney, Agent, or Firm*—Morgan & Finnegan, LLP

(57) ABSTRACT

This invention is to prevent a substrate from dropping when it is transferred/received to/from a separating apparatus. The support surfaces of substrate holding portions (22, 23) are made horizontal, and a substrate (21) to be separated is mounted on one substrate holding portion (22) in a horizontal state (2A). The substrate holding portions (22, 23) are pivoted about rotary shafts (26, 27), respectively, to make the support surfaces of the substrate holding portions (22, 23) vertical so that the substrate (21) is sandwiched by the substrate holding portions (22, 23) (2B). The substrate holding portions (22, 23) are rotated about rotary shafts (24, 25), respectively, and simultaneously, high-pressure, high-speed water is ejected from an ejection nozzle (28) to separate the substrate (21) into two substrates (21a, 21c). The substrate holding portions (22, 23) are pivoted about the rotary shafts (26, 27), respectively, to make the support surfaces horizontal (2C). With this arrangement, the substrate can be supported from the lower side and transferred in the horizontal state.

71 Claims, 12 Drawing Sheets

U.S. PATENT DOCUMENTS

| | | |
|---|---|---|
| 5,371,037 A | 12/1994 | Yonehara |
| 5,374,564 A | 12/1994 | Bruel |
| 5,447,596 A | 9/1995 | Hayase ............... 156/584 |
| 5,671,530 A * | 9/1997 | Combs et al. ............ 29/426.3 |
| 5,707,498 A * | 1/1998 | Ngan .................... 204/192.12 |
| 5,783,022 A * | 7/1998 | Cha et al. ............... 156/344 |
| 5,856,229 A | 1/1999 | Sakaguchi et al. |
| 5,863,830 A | 1/1999 | Bruel et al. |
| 5,994,207 A * | 11/1999 | Henley et al. ............ 438/515 |

FOREIGN PATENT DOCUMENTS

| | | |
|---|---|---|
| EP | 0886300 A2 | 12/1998 |
| JP | 5-21338 | 1/1993 |
| JP | 7-302889 | 11/1995 |
| JP | 09167724 A | 6/1997 |
| WO | WO 98/52216 | 11/1998 |

* cited by examiner

MEMBER SEPARATING APPARATUS AND PROCESSING APPARATUS

BACKGROUND OF THE INVENTION

1. Field of the Invention

The present invention relates to a member separating apparatus and processing apparatus, member separating method, and semiconductor substrate manufacturing method.

2. Description of the Related Art

A substrate (SOI substrate) having an SOI (Silicon On Insulator) structure is known as a substrate having a single-crystal Si layer on an insulating layer. A device using this SOI substrate has many advantages that cannot be achieved by ordinary Si substrates. Examples of the advantages are as follows.

(1) The integration degree can be increased because dielectric isolation is easy.

(2) The radiation resistance can be increased.

(3) The operating speed of the device can be increased because the stray capacitance is small.

(4) No well step is necessary.

(5) Latch-up can be prevented.

(6) A completely depleted field-effect transistor can be formed by thin film formation.

Since an SOI structure has the above various advantages, researches have been made on its formation method for several decades.

As one SOI technology, the SOS (Silicon On Sapphire) technology by which Si is heteroepitaxially grown on a single-crystal sapphire substrate by CVD (Chemical Vapor Deposition) has been known for a long time. This SOS technology once earned a reputation as the most matured SOI technology. However, the SOS technology has not been put into practical use to date because, e.g., a large amount of crystal defects are produced by lattice mismatch in the interface between the Si layer and the underlying sapphire substrate, aluminum that forms the sapphire substrate mixes in the Si layer, the substrate is expensive, and it is difficult to obtain a large area.

A variety of SOI technologies have been introduced next to the SOS technology. Various techniques have been examined about these SOI technologies aiming at decreasing crystal defects and reducing the manufacturing cost. Examples of the techniques are as follows. First, oxygen ions are implanted into a substrate to form a buried oxide layer. Second, two wafers are bonded via an oxide film, and one of the wafers is polished or etched to leave a thin single-crystal Si layer on the oxide film. Third, hydrogen ions are implanted from the surface of an Si substrate having an oxide film to a predetermined depth, the substrate is bonded to another substrate, a thin single-crystal Si layer is left on the oxide film by heating or the like, and the bonded substrate (the other substrate) is peeled.

The present applicant has disclosed a new SOI technology in Japanese Patent Laid-Open No. 5-21338. In this technology, a first substrate prepared by forming a nonporous single-crystal layer on a single-crystal semiconductor substrate having a porous layer is bonded to a second substrate via an insulating layer ($SiO_2$). After this, the substrates are separated at the porous layer, thereby transferring the nonporous single-crystal layer to the second substrate. Advantages of this technology are that the film thickness uniformity of the SOI layer is excellent, the crystal defect density in the SOI layer can be reduced, the surface planarity of the SOI layer is good, no expensive manufacturing apparatuses with special specifications are required, and SOI substrates having SOI films having a thickness of several hundred Å to 10 µm can be manufactured by one manufacturing apparatus.

The present applicant has also disclosed, in Japanese Patent Laid-Open No. 7-302889, a technique of bonding the first and second substrates, separating the first substrate from the second substrate without destroying the first substrate, smoothing the surface of the separated first substrate, and forming a porous layer again to reuse the first substrate. In this technique, the first substrate is not wasted, and therefore, the manufacturing cost can be largely reduced, and the manufacturing process can also be simplified.

To facilitate mass production using the above techniques, factors to lower the yield must be minimized. For example, in a series of processes of separating a bonded substrate stack at a porous layer, it is important to avoid risks of substrate drop.

SUMMARY OF THE INVENTION

The present invention has been made in consideration of the above situation, and has as its object to provide a separating apparatus and method suitable to separate member such as substrates, a processing apparatus suitable to process members such as substrates, and a semiconductor substrate manufacturing method using the separating method.

According to the present invention, there is provided a member separating apparatus characterized by comprising manipulation means for changing a direction of a major surface of a member, and separation means for separating the member using a stream of a fluid, wherein the manipulation means has a function of manipulating the member to match the direction of the major surface with a first direction and a function of manipulating the member to match the direction of the major surface with a second direction.

In the separating apparatus, the manipulation means preferably receives the member with the major surface whose direction matches with the first direction, matches the direction of the major surface with the second direction, and moves the member to a position where the separation means can process the member, and also matches a direction of a major surface of at least one member of the members separated by the separation means with the first direction.

In the separating apparatus, the manipulation means preferably receives the member with the major surface whose direction matches with the first direction, matches the direction of the major surface with the second direction, and moves the member to a position where the separation means can process the member, and also matches directions of major surfaces of members of the members separated by the separation means with the first direction.

In the separating apparatus, the first and second directions are preferably substantially perpendicular to each other.

In the separating apparatus, the first direction is preferably a direction in which the major surface of the member is substantially horizontal.

In the separating apparatus, preferably, the member to be processed comprises a plate member, and the separation means cuts the plate member in a direction of plane to separate the member into two plate members.

In the separating apparatus, preferably, the second direction is a direction in which the major surface of the plate member is substantially vertical, and the separation means ejects the fluid toward the plate member in the vertical direction to separate the plate member into two plate members.

In the separating apparatus, the first direction is preferably a direction in which the major surface of the plate member is substantially horizontal.

In the separating apparatus, the manipulation means preferably comprises a pair of holding means for holding the plate member by sandwiching the member from two surface sides when the separation means separates the plate member.

In the separating apparatus, each of the holding means preferably comprises chuck means for chucking the plate member.

In the separating apparatus, preferably, the manipulation means comprises pivot means for pivoting at least one of the pair of holding means about a shaft parallel to a chuck surface of the chuck means, and the direction of the major surface of the plate member is changed by the pivot means.

In the separating apparatus, preferably, the manipulation means comprises pivot means for pivoting the pair of holding means about shafts parallel to chuck surfaces of the chuck means, and the direction of the major surface of the plate member is changed by the pivot means.

In the separating apparatus, the shaft as a pivot center of the holding means is preferably arranged at a position where the pair of holding means do not interfere with each other.

The separating apparatus preferably further comprises rotation means for rotating the member about a shaft perpendicular to the major surface.

In the separating apparatus, the rotation means preferably comprises means for rotating the member when the separation means separates the member.

In the separating apparatus, preferably, the separation means separates the member using a stream of a liquid, and the rotation means comprises means for rotating at least one of the members separated by the separation means to remove the liquid sticking to the member.

The separating apparatus preferably further comprises rotation means for rotating at least one of the pair of holding means about a shaft perpendicular to a holding surface.

In the separating apparatus, the rotation means preferably rotates the holding means when the separation mean separates the member.

In the separating apparatus, preferably, the separation means separates the member using a stream of a liquid, and the rotation means rotates the holding means to remove the liquid sticking to the member held by the holding means after the member is separated by the separation means.

The separating apparatus preferably further comprises a chamber for covering the apparatus.

In the separating apparatus, the chamber preferably has a shutter capable of opening/closing.

The separating apparatus preferably further comprises transfer means for transferring the member to be processed to the manipulation means and receiving the separated member from the manipulation means, the transfer means being arranged outside the chamber and transferring/receiving the member to/from the manipulation means while opening the shutter.

In the separating apparatus, the shutter is preferably closed at least when the member is separated by the separation means.

The separating apparatus preferably further comprises positioning means for positioning the member to be processed with respect to the manipulation means.

In the separating apparatus, preferably, the member to be separated has a fragile layer as a separation layer, and the fragile layer is substantially parallel to the major surface of the member.

According to the present invention, there is also provided a member processing apparatus characterized by comprising manipulation means for changing a direction of a major surface of a member, rotation means for rotating the member about a shaft perpendicular to the major surface, and processing means for processing the member while the rotation means is rotating the member, wherein the manipulation means receives the member with the major surface whose direction matches with a first direction, matches the direction of the major surface with a second direction, and moves the member to a position where the processing means can process the member, and also matches the direction of the major surface of the member which has been processed by the processing means with the first direction.

In the processing apparatus, the first and second directions are preferably substantially perpendicular to each other.

In the processing apparatus, the first direction is preferably a direction in which the major surface of the member is substantially horizontal.

In the processing apparatus, preferably, the processing means processes the member using a liquid, and the rotation means rotates the member to remove the liquid sticking to the member after the member is processed by the processing means.

According to the present invention, there is also provided a processing apparatus characterized by comprising holding means for holding a member, manipulation means for changing a direction of a holding surface of the holding means, processing means for processing the member held by the holding means, and rotation means for rotating the holding means holding the member about a shaft perpendicular to the holding surface when the processing means is processing and/or has processed the member, wherein the manipulation means matches the direction of the holding surface with a first direction when the holding means is to receive the member to be processed, matches the direction of the holding surface of the holding means with a second direction after the holding means receives and holds the member, and moves the holding means to a position where the processing means can process the member, and also matches the direction of the holding surface of the holding means with the first direction after processing by the processing means is complete.

In the processing apparatus, the first and second directions are preferably substantially perpendicular to each other.

In the processing apparatus, the first direction is preferably a direction in which the major surface of the member is substantially horizontal.

In the processing apparatus, preferably, the processing means processes the member using a liquid, and the rotation means rotates the member to remove the liquid sticking to the member after the member is processed by the processing means.

According to the present invention, there is provided a member separating method characterized by comprising the reception step of receiving a member with a major surface whose direction matches with a first direction, the manipulation step of matching the direction of the major surface of the member with a second direction, and the separation step of separating the member using a stream of a fluid.

The separating method preferably further comprises the second manipulation step of matching a direction of a major surface of at least one member of the members separated in the separation step with the first direction.

The separating method preferably further comprises the second manipulation step of matching directions of major surfaces of the members separated in the separation step with the first direction.

In the separating method, the first and second directions are preferably substantially perpendicular to each other.

In the separating method, the first direction is preferably a direction in which the major surface of the member is substantially horizontal.

In the separating method, preferably, the member to be processed comprises a plate member, and the separation step comprises cutting the plate member in a direction of plane to separate the member into two plate members.

In the separating method, preferably, the second direction is a direction in which the major surface of the plate member is substantially vertical, and the separation step comprises ejecting the fluid toward the plate member in the vertical direction to separate the plate member into two plate members.

In the separating method, the first direction is preferably a direction in which the major surface of the plate member is substantially horizontal.

In the separating method, the separation step preferably comprises holding the plate member by sandwiching the member from two surface sides.

In the separating method, the separation step preferably comprises separating the member using the stream of a fluid while rotating the member to be processed about a shaft perpendicular to the major surface.

In the separating method, preferably, the separation step comprises separating the member using a liquid, and the method further comprises rotating at least one of the members separated to remove the liquid sticking to the member after the member is separated in the separation step.

In the separating method, the separation step is preferably executed in a chamber to prevent the fluid from scattering.

In the separating method, preferably, the member to be processed has a fragile layer as a separation layer, and the fragile layer is substantially parallel to the major surface of the member.

In the separating method, the fragile layer preferably comprises a porous layer.

In the separating method, the fragile layer preferably comprises a layer having microcavity.

In the separating method, preferably, the member to be processed is prepared by bonding at least two plate members, and at least one of the two plate members comprises a semiconductor substrate.

In the separating method, the semiconductor substrate preferably comprises a single-crystal silicon substrate.

In the separating method, preferably, the member to be processed is prepared by bonding at least two plate members, and at least one of the two plate members comprises an insulating substrate.

In the separating method, the insulating substrate preferably comprises a quartz substrate.

In the separating method, preferably, the member to be processed is prepared by bonding at least two plate members, and at least one of the two plate members comprises a transparent substrate.

In the separating method, the member to be processed is preferably prepared by bonding a first substrate sequentially having a nonporous layer and a porous layer inward from a surface to a second substrate via the nonporous layer.

In the separating method, the nonporous layer preferably has a single-crystal silicon layer.

In the separating method, the nonporous layer preferably has an insulating layer on the single-crystal silicon layer.

In the separating method, the insulating layer is preferably formed from a silicon oxide.

In the separating method, the second substrate preferably comprises an insulating substrate.

In the separating method, the second substrate preferably comprises a transparent substrate.

In the separating method, the second substrate preferably comprises a quartz substrate.

In the separating method, the porous layer is preferably formed by anodizing a single-crystal silicon substrate.

In the separating method, the member to be processed is preferably prepared by bonding a second substrate to a surface of a first substrate incorporating a microcavity layer.

In the separating method, the microcavity layer is preferably formed by implanting ions into a single-crystal silicon substrate.

In the separating method, water is preferably used as the fluid.

According to the present invention, there is provided a semiconductor substrate manufacturing method characterized by comprising the steps of preparing a first substrate incorporating a porous layer or a microcavity layer, bonding the first substrate to a second substrate to prepare a bonded substrate stack, separating the bonded substrate stack into a first substrate side and a second substrate side using the porous layer or microcavity layer as a separation region by using any one of the above separating methods, and removing the porous layer or microcavity layer remaining on the second substrate side.

The semiconductor substrate manufacturing method preferably further comprises the step of, after the bonded substrate stack is separated, removing the porous layer or microcavity layer remaining on the first substrate side to reuse the first substrate.

In the semiconductor substrate manufacturing method, the porous layer is preferably formed by anodizing a semiconductor substrate.

In the semiconductor substrate manufacturing method, the microcavity layer is preferably formed by implanting ions in a semiconductor substrate.

Further objects, features and advantages of the present invention will become apparent from the following detailed description of the embodiments of the present invention with reference to the accompanying drawings.

DETAILED DESCRIPTION OF THE PREFERRED EMBODIMENT

A preferred embodiment of the present invention will be described below with reference to the accompanying drawings.

FIGS. 1A to 1E are views for explaining steps in manufacturing an SOI substrate according to a preferred embodiment of the present invention.

Figure 1A:
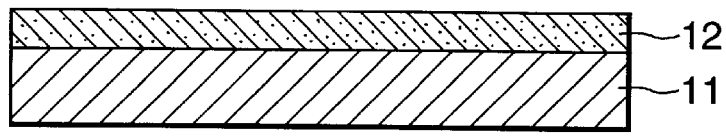
FIGS. 1A to 1E are views for explaining steps in manufacturing an SOI substrate according to a preferred embodiment of the present invention.
Figure 1B:
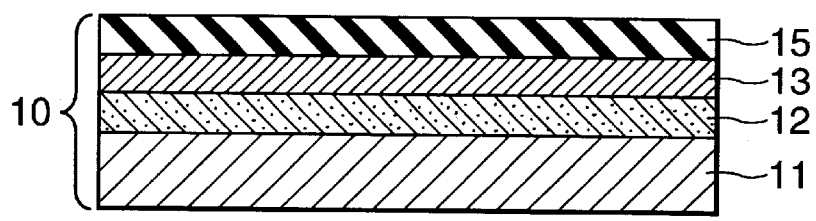

In the step shown in FIG. 1A, a single-crystal Si substrate 11 is prepared, and a porous Si layer 12 is formed on the substrate surface by anodizing or the like. In the step shown in FIG. 1B, a nonporous single-crystal Si layer 13 is formed on the porous Si layer 12 by epitaxial growth. After this, the surface is oxidized to form an SiO2 layer 15. With this process, a first substrate 10 is formed.

Figure 1C:
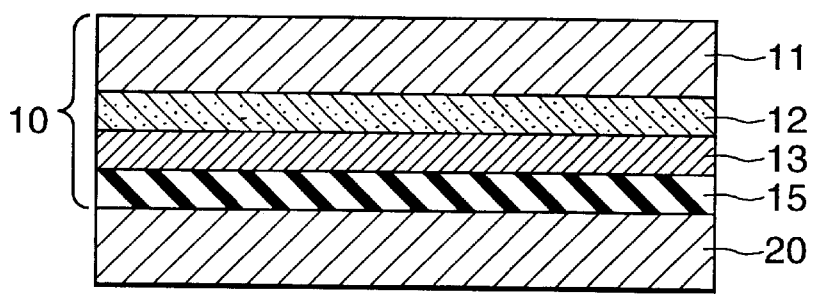

In the step shown in FIG. 1C, a second substrate 20 consisting of single-crystal Si is prepared. The first and second substrates 10 and 20 are brought into contact with each other at room temperature such that the second substrate 20 opposes an insulating layer 15. After this, the first and second substrates 10 and 20 are bonded by anodic bonding, pressing, heating, or a combination thereof. The insulating layer 15 may be formed on the nonporous single-crystal Si layer 13, as described above, on the second substrate 20, or on both of them as far as the state shown in FIG. 1C is obtained when the first and second substrates are brought into contact with each other.

Figure 1D:
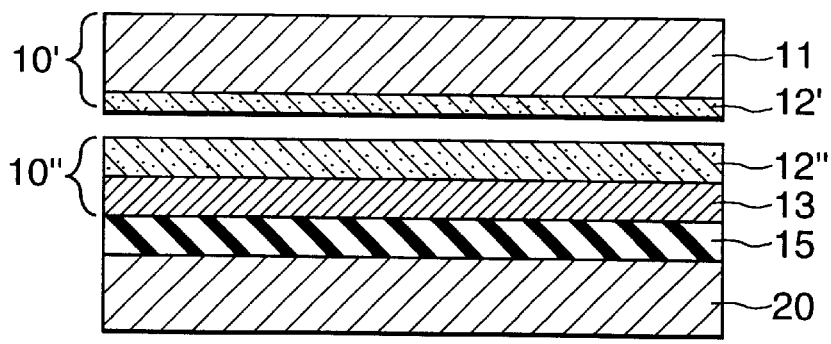

In the step shown in FIG. 1D, the two substrates bonded to each other are separated at the porous Si layer 12, for example into layers having substantially equal dimensions. Consequently, a multilayered structure of a porous Si layer 12", single-crystal Si layer 13, insulating layer 15, and the single-crystal Si substrate 20 is formed on the second substrate side (10"+20). On the first substrate side (10'), a porous layer 12' is formed on the single-crystal Si substrate 11.

After separation, the porous Si layer 12' left on the first substrate is removed, and the substrate surface is planarized as needed, thereby reusing the first substrate as the single-crystal Si substrate 11 for forming the first substrate 10.

Figure 1E:
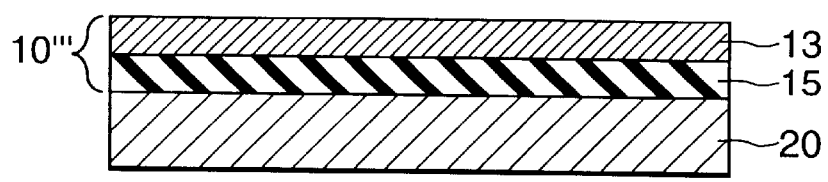

After the bonded substrates are separated, in the step shown in FIG. 1E, the porous layer 12" on the surface on the second substrate side (10"+20) is selectively removed. With this process, a multilayered structure of the single-crystal Si layer 13, insulating layer 15, and single-crystal Si substrate 20, i.e., a substrate having an SOI structure is obtained.

As the second substrate, not only the single-crystal Si substrate but also an insulating substrate (e.g., a quartz substrate) or a transparent substrate (e.g., a quartz substrate) can be used.

In this embodiment, to facilitate the process of bonding two substrates and then separating them, the porous layer 12 having a fragile structure is formed in the separation region. Instead of the porous layer, for example, a microcavity layer may be formed. A microcavity layer can be formed by implanting ions into a semiconductor substrate.

In this embodiment, in the step shown in FIG. 1D, i.e., in the process of separating a substrate (to be referred to as a bonded substrate stack hereinafter) prepared by bonding two substrates, a high-pressure liquid or gas (fluid) is injected toward the separation region of the bonded substrate stack to break the porous layer, thereby separating the bonded substrate stack into two substrates.

Principle of Separating Apparatus

The principle of a separating apparatus according to preferred embodiment of the present invention will be described first. The separating apparatus of this embodiment uses a water jet method. Generally, the water jet method ejects high-speed, high-pressure stream of water to an object to, e.g., process, remove a coating film from the surface, or clean the surface ("History of Water Jet Machining Development", Journal of Water Jet Technology Society of Japan, Vol. 1, No. 1, page 4 (1984)).

This separating apparatus ejects a high-speed, high-pressure stream of a liquid or gas (fluid) to the porous layer (separation region) of a bonded substrate stack in the direction of substrate surface to selectively break the porous layer, thereby separating the substrate stack at the porous layer. The stream will be referred to as a "jet" hereinafter. The liquid or gas (fluid) forming a jet will be referred to as a "jet medium". As the jet medium, it is possible to use water, an organic solvent such as alcohol, an acid such as hydrofluoric acid or nitric acid, an alkali such as potassium hydroxide, other alkalis, a gas such as air, nitrogen gas, carbonic acid gas, rare gas, or an etching gas or other gases.

Figure 2A:
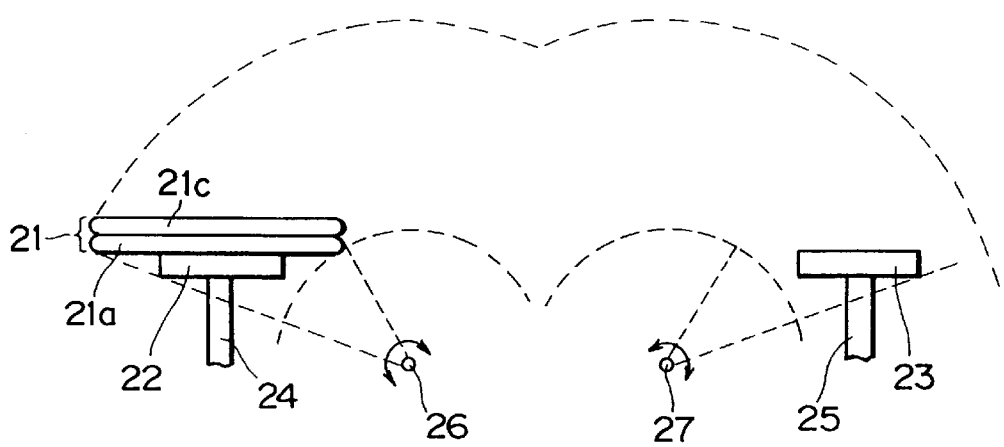
FIGS. 2A to 2C are views showing the principle of a separating apparatus according to a preferred embodiment of the present invention.
Figure 2B:
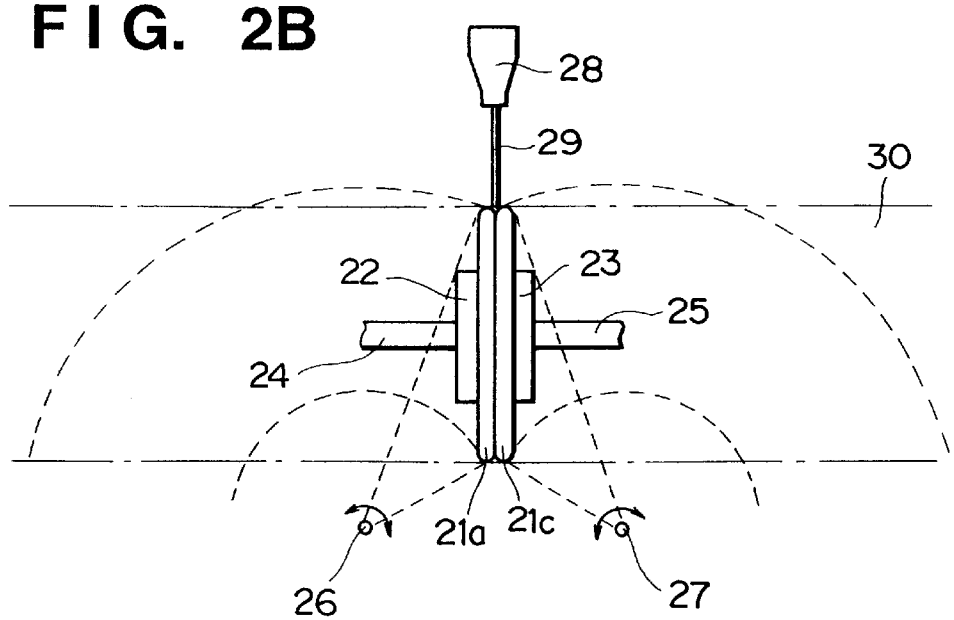
Figure 2C:
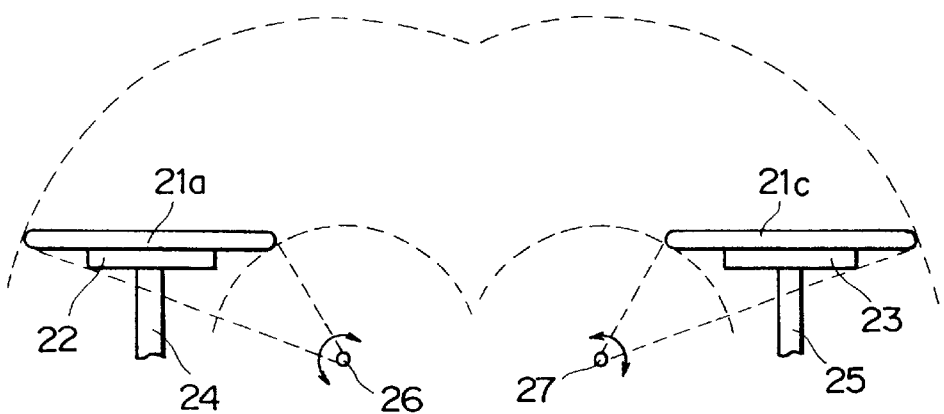

FIGS. 2A to 2C are views showing the principle of the separating apparatus of the preferred embodiment of the present invention. This separating apparatus has a pair of substrate holding portions 22 and 23 for supporting a substrate. Rotary shafts 24 and 25 are coupled to the substrate holding portions 22 and 23, respectively. The substrate holding portions 22 and 23 are supported to freely pivot about rotary shafts 26 and 27, respectively.

To separate a bonded substrate stack 21 into two substrates 21a and 21c, first, the substrate support surfaces of the substrate holding portions 22 and 23 are made horizontal, as shown in FIG. 2A. The bonded substrate stack 21 is mounted at a predetermined position on the substrate holding portion 22 and chucked on the substrate support surface.

Next, as shown in FIG. 2B, the substrate holding portions 22 and 23 are pivoted about the rotary shafts 26 and 27, respectively, to oppose them each other, so the bonded substrate stack 21 is sandwiched and held by the substrate holding portions 22 and 23. At this time, the substrate support surfaces of the substrate holding portions 22 and 23 are vertical.

In this state, a jet medium (e.g., water) 29 is ejected from an ejection nozzle 28 and injected into the separation region (porous region) of the bonded substrate stack 21 while the bonded substrate stack 21 is rotated about the rotary shafts 24 and 25. With this operation, the bonded substrate stack 21 is separated into the two substrates 21a and 21c. During this separating, the bonded substrate stack 21 can be held without vacuum chuck.

As shown in FIG. 2C, the substrate holding portions 22 and 23 are pivoted about the rotary shafts 26 and 27, respectively, until the substrate support surfaces become horizontal. During this operation, the substrate 21a is chucked by the substrate holding portion 22, and the substrate 21c is chucked by the substrate holding portion 23.

Then a liquid such as water is used as the jet medium, the separated substrates 21a and 21c can be dried by rotating the substrate holding portions 22 and 23 about the rotary shafts 24 and 25 at a high speed, respectively.

In the state shown in FIG. 2B, i.e., when the bonded substrate stack is sandwiched by the substrate holding portions 22 and 23, the rotary shafts 26 and 27 must be outside a space (projection space) 30 formed by projecting the surface of the bonded substrate stack 21 in the axial direction to prevent interference between the substrate holding portions 22 and 23. However, if a mechanism for moving one or both of the substrate holding portions 22 and 23 in the horizontal direction is arranged, the substrate holding portions 22 and 23 can be placed in the projection space 30.

With the above-described separating apparatus, the bonded substrate stack 21 can be transferred to the separating apparatus in the horizontal state, and the separated substrates 21a and 21c can be received from the separating apparatus in the horizontal state. In the arrangement which allows substrate transfer in the horizontal state, the substrates can be supported from the lower side. Hence, risks of substrate drop during conveyance or transfer are decreased.

Specific arrangements of the separating apparatus of the preferred embodiment of the present invention will be described below.

First Arrangement of Separating Apparatus

FIGS. 3 to 7 are schematic views showing the first arrangement of a separating apparatus. A separating apparatus 100 comprises a pair of substrate manipulation portions 150 and 160 for manipulating substrates.

The substrate manipulation portions 150 and 160 have substrate holding portions 108 and 109 for supporting substrates, respectively. The substrate holding portions 108 and 109 have vacuum chuck grooves 108a and 109a as a mechanism for chucking the substrate. The chucks 108a and 109a communicate with vacuum lines extending through rotary shafts 106 and 107, respectively. The vacuum lines are connected to an external vacuum line through a rotary vacuum joint.

A bonded substrate stack 101 to be processed incorporates a porous layer 101b as a fragile structure portion and is separated into two substrates 101a and 101c at the porous layer 101b.

Figure 5:
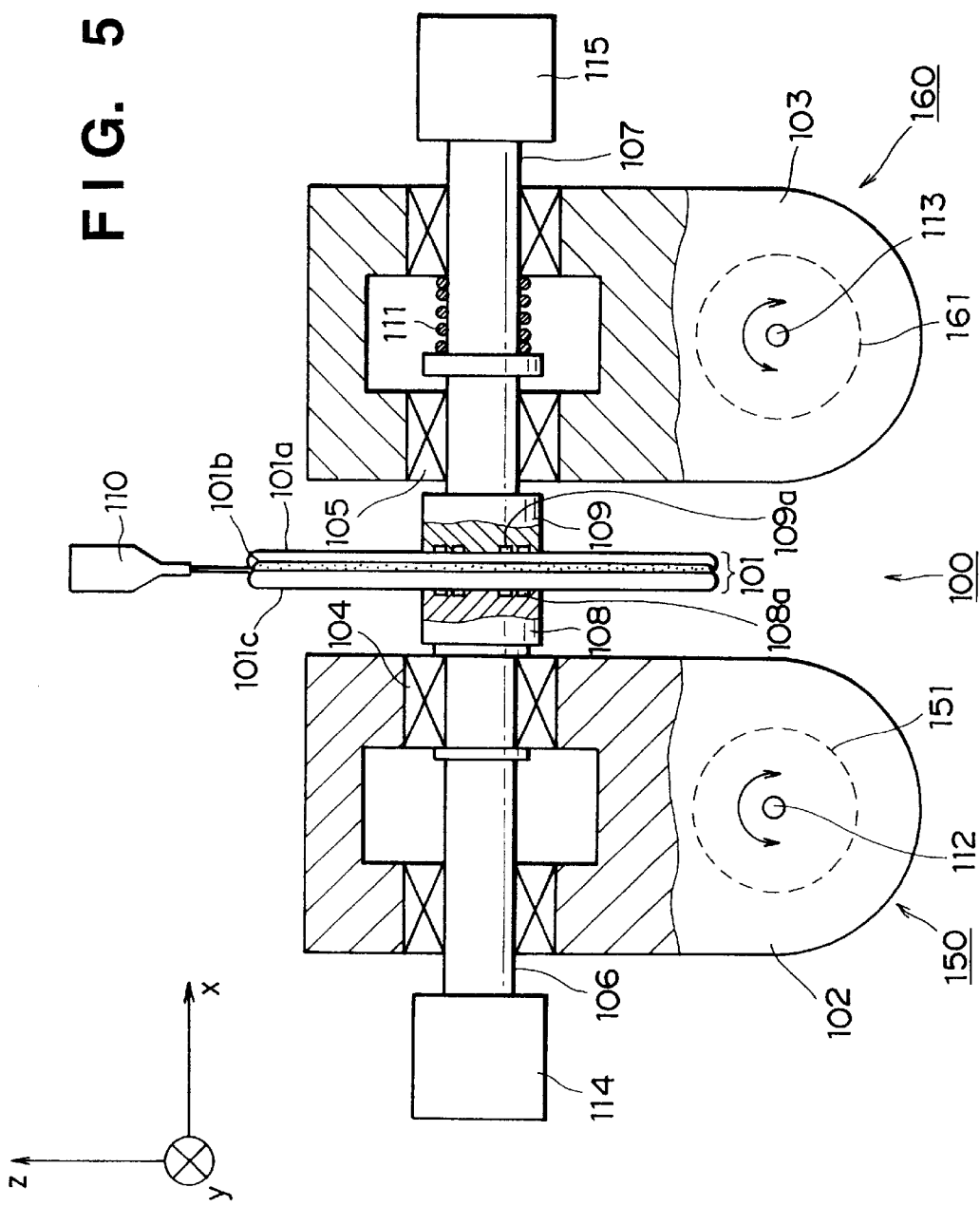
FIG. 5 is a schematic view showing the first arrangement of the separating apparatus.

To separate the bonded substrate stack 101, the bonded substrate stack 101 is sandwiched and supported vertically by the substrate holding portions 108 and 109, as shown in FIG. 5.

In this separating apparatus 100, for example, the bonded substrate stack is set such that the substrate 101a is present on the first substrate side (10'), and the substrate 101c is present on the second substrate side (10'+20) in FIG. 1D.

The substrate holding portion 108 is coupled to one end of the rotary shaft 106 axially and rotatably supported by a shaft support portion 102 through a bearing 104. The other end of the rotary shaft 106 is coupled to a driving source 114. As the driving source 114, for example, a motor is suitable. In separation processing, the bonded substrate stack 101 is rotated by a rotational force transmitted from the driving source 114. The driving source 114 rotates the rotary shaft 106 at a rotation rate designated in accordance with an instruction from a controller (not shown).

On the other hand, the substrate holding portions 109 is coupled to one end of the rotary shaft 107 axially and rotatably supported by the shaft support portion 103 through a bearing 105. The other end of the rotary shaft 107 is coupled to a driving source 115. As the driving source 115, for example, a motor is suitable. In separation processing, the bonded substrate stack 101 is rotated by a rotational force transmitted from the driving source 115. The driving source 115 rotates the rotary shaft 107 in synchronism with rotation of the rotary shaft 106 in accordance with an instruction from the controller (not shown). The rotary shafts 106 and 107 are rotated in synchronism with each other to prevent twist of the bonded substrate stack 101.

Independent driving sources may be coupled to the rotary shafts 106 and 107, respectively, as described above. However, using a single driving source, the rotational force generated by the driving source may be distributed to the rotary shafts 106 and 107. In this case, the rotary shafts 106 and 107 can easily be rotated in synchronism with each other.

Alternatively, only one of the rotary shafts 106 and 107 may be driven. For example, when only the driving source 114 for driving the rotary shaft 106 is arranged, the rotary shaft 106, substrate holding portion 108, bonded substrate stack 101, substrate holding portion 109, and rotary shaft 107 integrally rotate before separation of the bonded substrate stack 101. When the bonded substrate stack 101 is separated into two substrates, the members on the rotary shaft 107 side stop.

The shaft support portion 103 on the rotary shaft 107 side incorporates a spring 111 for pressing the bonded substrate stack 101. Hence, the bonded substrate stack 101 receives a force in a direction in which the substrate 101a is pressed against the substrate 101c (negative direction of the X-axis). As a result, after the bonded substrate stack 101 is separated into the two substrates 101a and 101c by a jet from an ejection nozzle 110, and even when the two substrates 101a and 101c are not vacuum-chucked by the substrate holding portions 109 and 108, respectively, the substrates 101a and 101c do not drop.

In this embodiment, the spring 111 applies a force in the direction in which the substrate 101a is pressed against the substrate 101c (negative direction of the X-axis). However, the force may be applied in a direction in which the substrate 101a is separated from the substrate 101c by changing the position of the spring. In this case, when the bonded substrate stack 101 is physically separated into the two substrates 101a and 101c by a jet from the ejection nozzle 110, the substrate 101a is separated from the substrate 101c.

The separating apparatus 100 has an adjustment mechanism for adjusting the clearance between the substrate holding portions 108 and 109. Specific examples of the adjustment mechanism will be described below.

Figure 8:
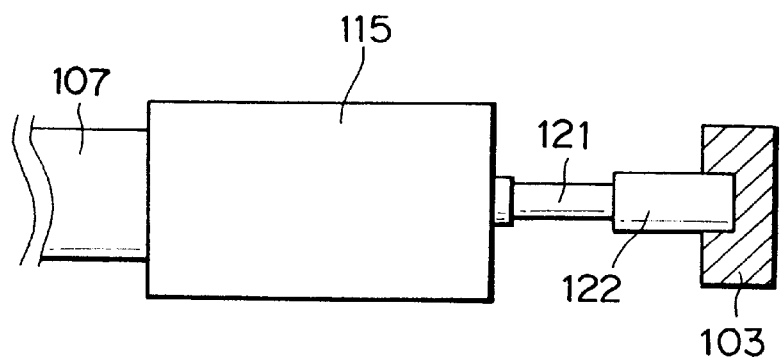
FIG. 8 is a view showing the first arrangement of an adjustment mechanism for adjusting the clearance between substrate holding portions.

FIG. 8 is a view showing the first arrangement of the adjustment mechanism. The adjustment mechanism shown in FIG. 8 uses an air cylinder 122. The air cylinder 122 is fixed to the shaft support portion 103. When a piston rod 121 is retracted (driven), the driving source (e.g., motor) 115 is pulled. When drive of the piston rod 121 is canceled, the force of the spring 111 can be made to act on the rotary shaft 107 to press the substrate.

Figure 9:
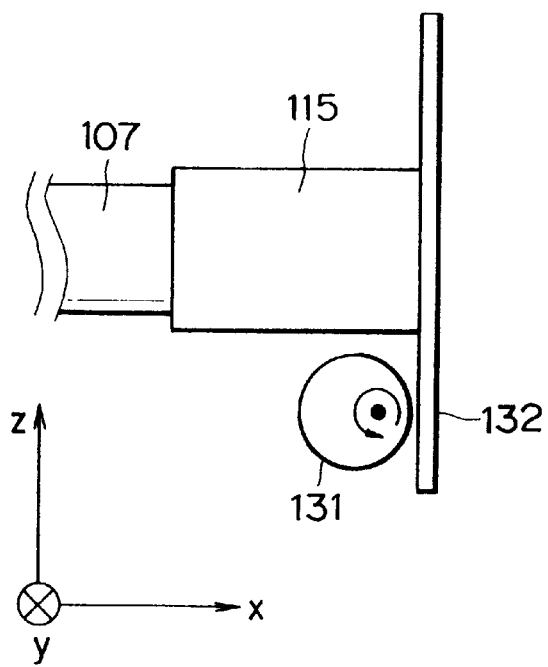
FIG. 9 is a view showing the second arrangement of an adjustment mechanism for adjusting the clearance between substrate holding portions.

FIG. 9 is a view showing the second arrangement of the adjustment mechanism. The adjustment mechanism shown in FIG. 9 uses an eccentric cam 131 and a motor. The eccentric cam 131 is coupled to a motor (not shown). The clearance between the substrate holding portions 108 and 109 is adjusted by moving a driving plate 132 coupled to the rear end of the driving source 115. The force of the spring 111 acts on the rotary shaft 107 in the direction in which the substrate is pressed. To hold the bonded substrate stack 101 and separate it into two substrates, the eccentric cam 131 is pivoted in a direction in which restriction of the driving plate 132 by the eccentric cam 131 is canceled, i.e., in a direction in which a gap is formed between the eccentric cam 131 and driving plate 132. With this operation, the pressing force of the spring 111 can be made to act on the bonded substrate stack 101.

Even when a spring acting in a direction in which the bonded substrate stack 101 is pulled is arranged in place of the spring 111, an adjustment mechanism for adjusting the clearance between the substrate holding portions 108 and 109 is necessary. In this case, the adjustment mechanism is used to push the substrate holding portion 109 until it comes in contact with the bonded substrate stack 101 to chuck the bonded substrate stack 101 on the substrate support surface of the substrate holding portion 109.

The separating apparatus 100 has driving sources (e.g., motors) 151 and 161 for rotating rotary shafts 112 and 113 to pivot the substrate manipulation portions 150 and 160, respectively. The driving sources 151 and 161 are fixed to, e.g., the main body frame of the separating apparatus 100.

Figure 3:
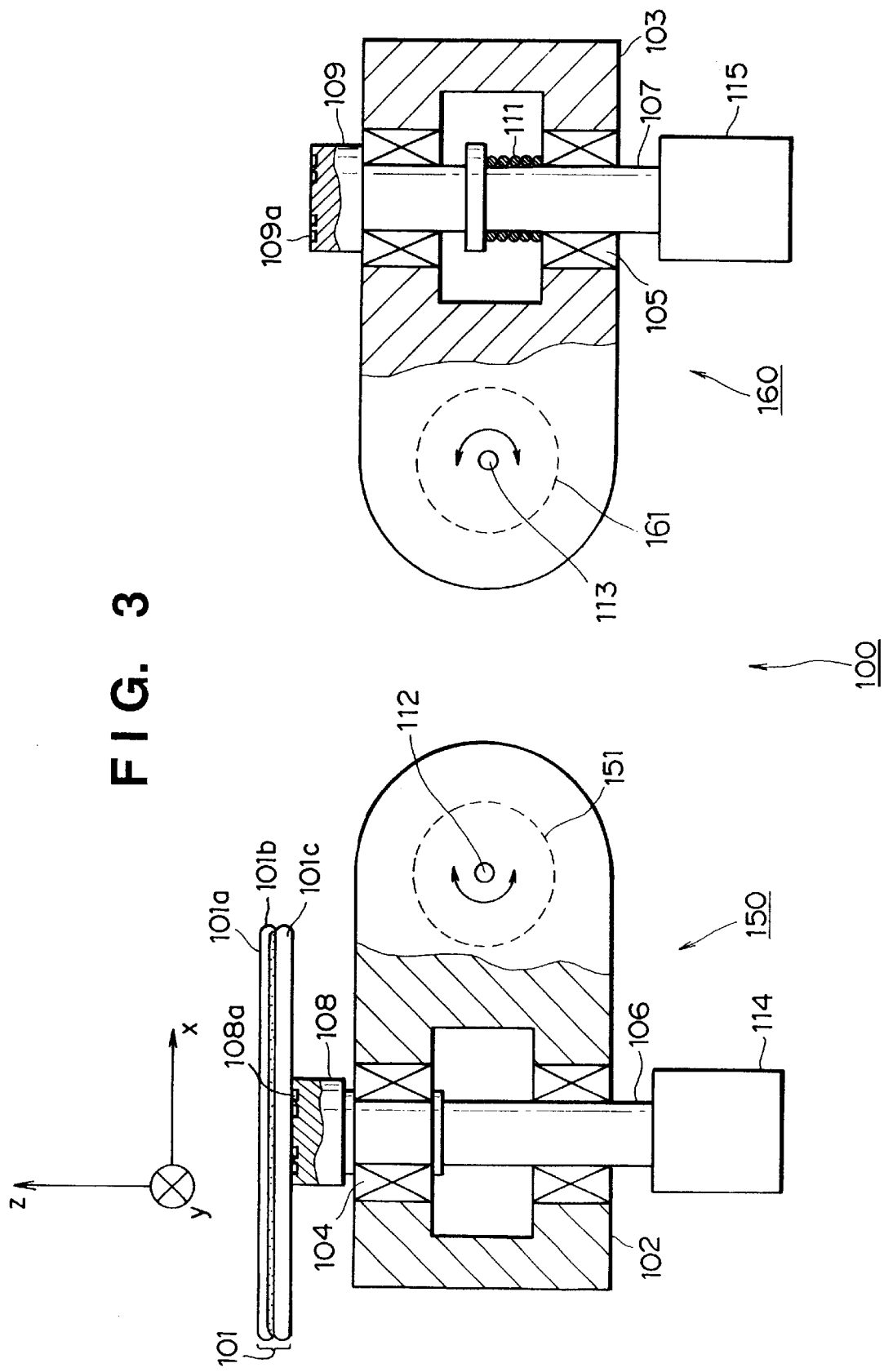
FIG. 3 is a schematic view showing the first arrangement of a separating apparatus.

As shown in FIG. 3, in the separating apparatus 100, the substrate manipulation portions 150 and 160 can be pivoted about the rotary shafts 112 and 113 by the driving sources 151 and 161 to make the substrate support surfaces of the substrate holding portions 108 and 109 horizontal or vertical, respectively.

Instead of preparing two driving sources for the substrate manipulation portions 150 and 160, respectively, a single driving source may be arranged. In this case, the output from the driving source is distributed to drive the substrate manipulation portions 150 and 160.

In the separating apparatus 100, the rotary shafts 112 and 113 are placed outside the space (projection space) formed by projecting the bonded substrate stack 101 in the axial direction when the bonded substrate stack 101 is sandwiched (supported vertically) by the substrate holding portions 108 and 109. In addition, the rotary shafts 112 and 113 are arranged in a direction parallel to the substrate support surfaces of the substrate holding portions 108 and 109 (Y-axis direction). Hence, the substrate manipulation portions 150 and 160 operate without interfering each other, and the bonded substrate stack 101 does not damage the separated substrates 101a and 101c.

Even when the rotary shafts 112 and 113 are placed in the projection space, interference between the substrate manipulation portions 150 and 160 can be avoided by increasing the retreat distance of the substrate holding portion 109 to the shaft support portion 103 side.

A series of procedures of bonded substrate stack separation processing by the separating apparatus 100 will be described below.

First, as shown in FIG. 3, the substrate manipulation portions 150 and 160 are driven by the driving sources 151 and 161 to make the substrate support surfaces of the substrate holding portions 108 and 109 horizontal, respectively. The substrate holding portion 109 is retracted into the shaft support portion 103 by the adjustment mechanism shown in FIG. 8 or 9, as shown in FIG. 3. In this state, the bonded substrate stack 101 is mounted on the substrate holding portion 108, and the pressure in the grooves 108a is reduced to chuck the bonded substrate stack 101 on the substrate support surface. The bonded substrate stack 101 is preferably mounted on the substrate holding portion 108 such that the center of the bonded substrate stack matches with the center of the substrate holding portion 108.

Figure 4:
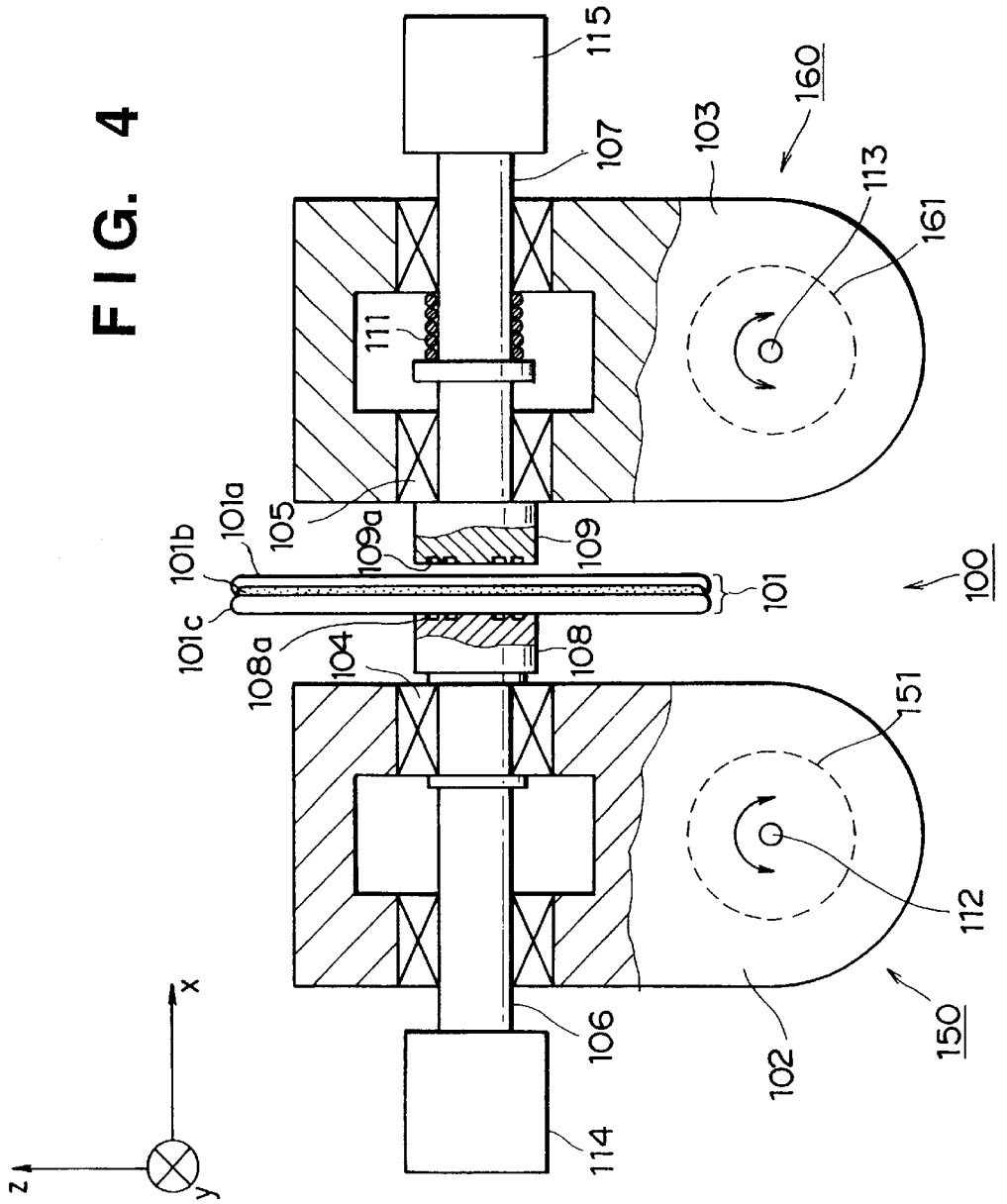
FIG. 4 is a schematic view showing the first arrangement of the separating apparatus.

Next, as shown in FIG. 4, the substrate manipulation portions 150 and 160 are pivoted by the driving sources 151 and 161 to make the substrate support surfaces of the substrate holding portions 108 and 109 vertical, respectively.

As shown in FIG. 5, the substrate holding portion 109 is pushed from the shaft support portion 103 by the action of the spring 111, so the bonded substrate stack 101 is pressed by the substrate holding portion 109. When the arrangement shown in FIG. 8 or 9 is employed, this operation can be realized by canceling restriction of the rotary shaft 107 by the air cylinder 122 or eccentric cam 131.

In this state, the bonded substrate stack 101 may be vacuum-chucked by one or both of the substrate holding portions 108 and 109. When the pressing force of the spring 111 suffices, the bonded substrate stack 101 can be held by only the pressing force without vacuum chuck.

Next, the driving sources 114 and 115 are operated in synchronism to rotate the bonded substrate stack 101. A jet medium (e.g., water) is compressed and supplied to the ejection nozzle 110 by a high-pressure pump (not shown) to inject the jet into the porous layer 101b as the separation region of the bonded substrate stack 101, i.e., in the vertical direction. When the jet is injected while rotating the bonded substrate stack 101, the bonded substrate stack 101 is separated into the two substrates 101a and 101c.

Figure 6:
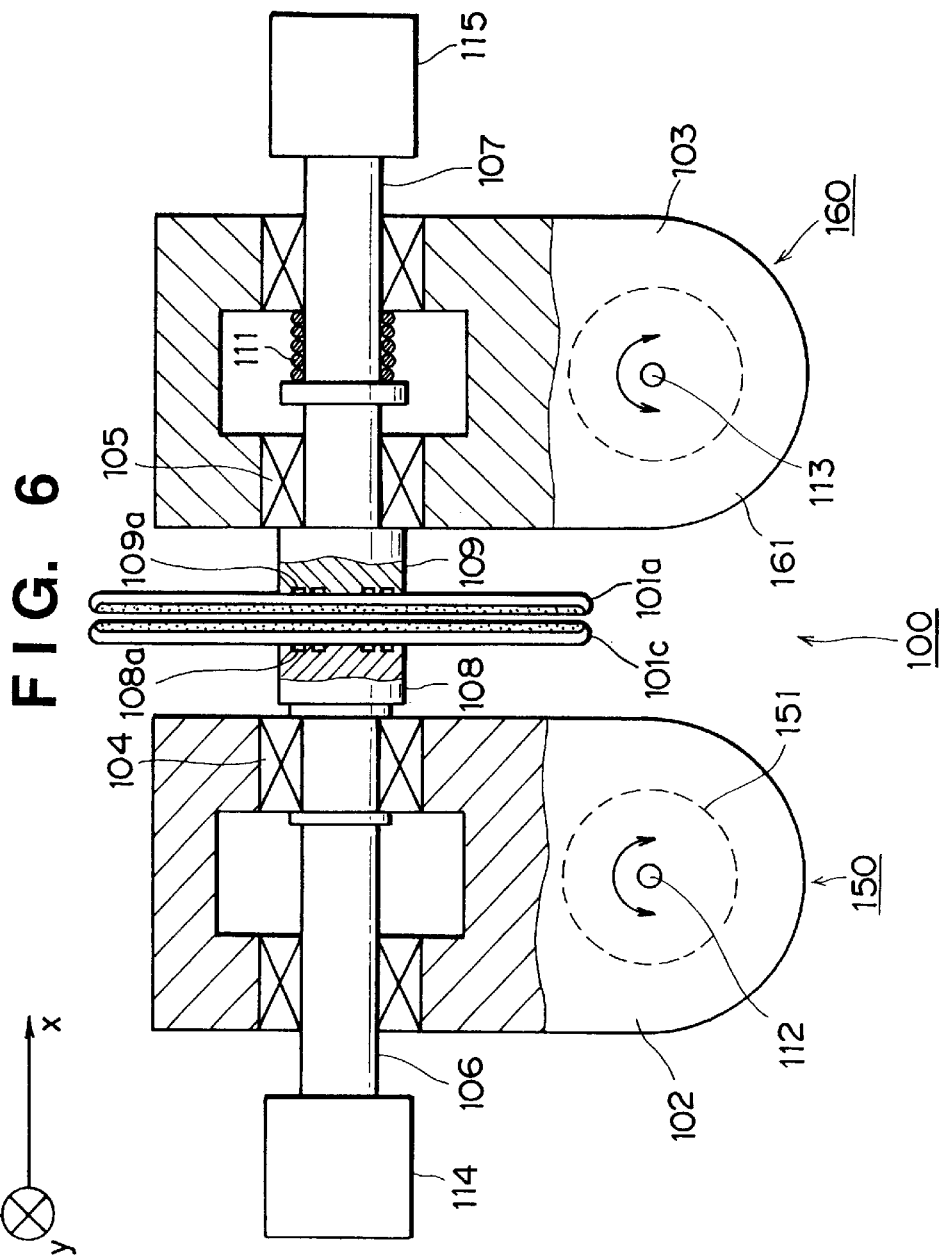
FIG. 6 is a schematic view showing the first arrangement of the separating apparatus.

After the bonded substrate stack 101 is physically separated into the two substrates, the substrate holding portions 108 and 109 is retreated to the shaft support portion 103 side by the adjustment mechanism shown in FIG. 8 or 9, as shown in FIG. 6. With this operation, the two substrates 101a and 101c which are physically separated are separated spatially. When the substrates 101a and 101c are not chucked by the substrate holding portions 109 and 108, respectively, in separating the bonded substrate stack 101, the substrates 101a and 101c need be chucked by the substrate holding portions 109 and 108, respectively, before the substrate holding portion 109 is retreated to the shaft support portion 103 side.

Figure 7:
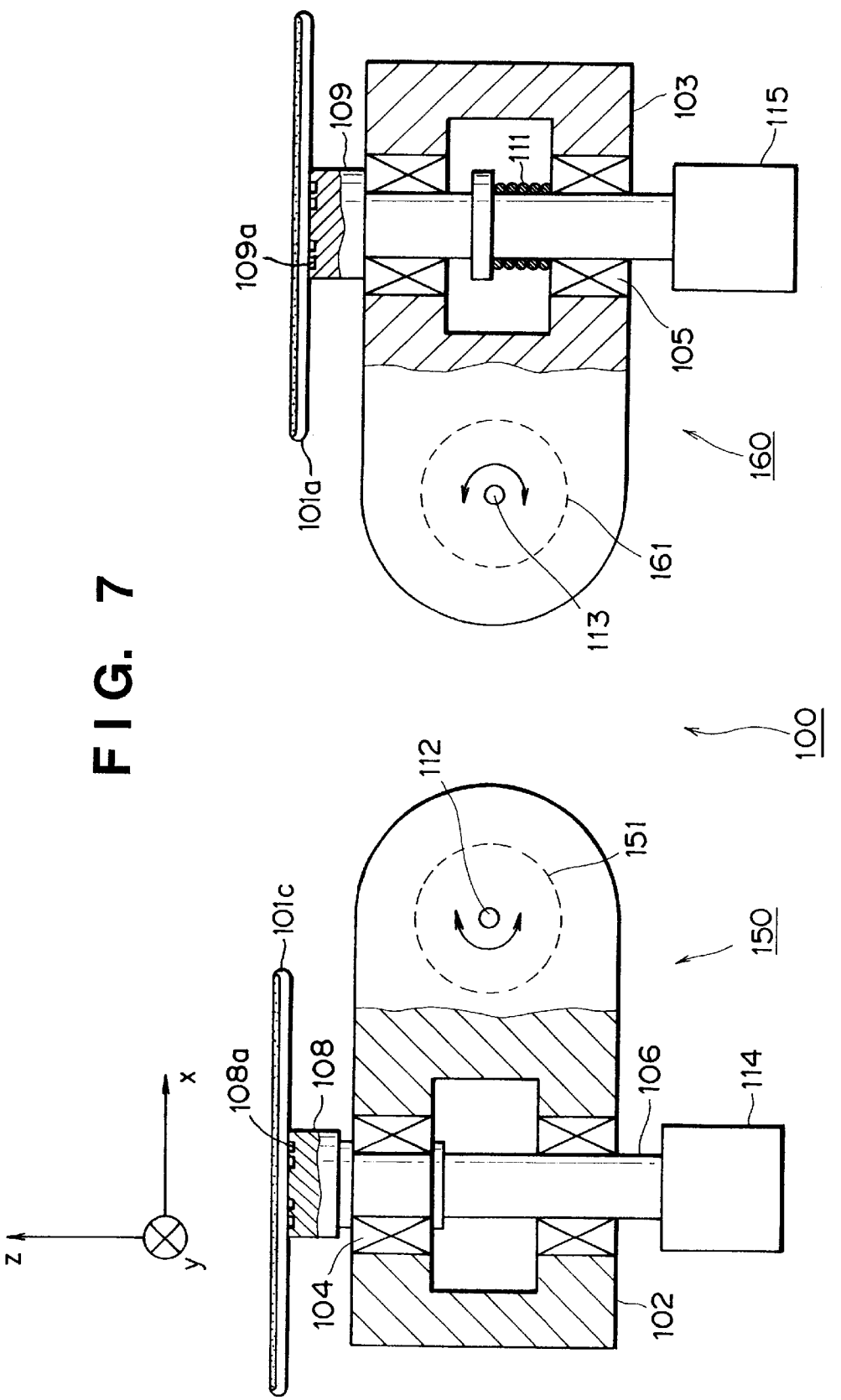
FIG. 7 is a schematic view showing the first arrangement of the separating apparatus.

As shown in FIG. 7, the substrate manipulation portions 150 and 160 are pivoted about the rotary shafts 112 and 113 by the driving sources 151 and 161 to make the substrate support surfaces of the substrate holding portions 108 and 109 horizontal, respectively. The substrates 101a and 101c are held horizontally.

When separation processing has been executed using a liquid as a jet medium, the jet medium remains on the separated substrates 101a and 101c. The jet medium sticking to the substrates 101a and 101c is preferably removed by rotating the substrate holding portions 108 and 109 by the driving sources 114 and 115, respectively, to dry the substrates (spin drying). For spin drying, a shielding plate for shielding the scattering jet medium is preferably inserted between the two substrate manipulation portions 150 and 160.

The substrates 101a and 101c may be transferred to another drying apparatus to dry them by the apparatus.

When one of the substrates is to be discarded, the substrate to be discarded need not always be dried.

As described above, the separating apparatus 100 executes separation processing while holding the bonded substrate stack vertically. One reason for this is that when the jet is not ejected in the vertical direction, the jet orbit is bent downward by gravitation, and it becomes difficult to inject the jet to the desired position (separation region) of the bonded substrate stack. Another reason is that when the separation surface (porous layer) of the bonded substrate stack is parallel to the direction of jet, the jet can efficiently act on the separation surface, so the efficiency of separation processing can be increased.

According to the separating apparatus 100 having the substrate manipulation portions 150 and 160, separation processing can be executed while holding the bonded substrate stack 101 vertically, and additionally, the bonded substrate stack can be transferred to the separating apparatus in the horizontal state, and the separated substrates can also be received in the horizontal state. Since the substrates can be supported from the lower side during substrate transfer, risks of substrate drop can be decreased. On the other hand, if a mechanism for transferring the bonded substrate stack to the separating apparatus in the vertical state or a mechanism for receiving the separated substrates in the vertical state is employed, the substrates may drop.

In addition, according to this separating apparatus, when the substrate support surfaces of the substrate holding portions 108 and 109 are set horizontally, a wide space can be ensured on the substrate support surfaces. This facilitates substrate transfer or reception.

Second Arrangement of Separating Apparatus

This embodiment is related to an automatic separating apparatus incorporating the separating apparatus 100 of the first arrangement, which automatically executes a series of operations of extracting a bonded substrate stack stored in a cassette, transferring it to the separating apparatus 100, separating a bonded substrate stack 101 in the separating apparatus 100, and storing the separated substrates in another cassette.

Figure 10:
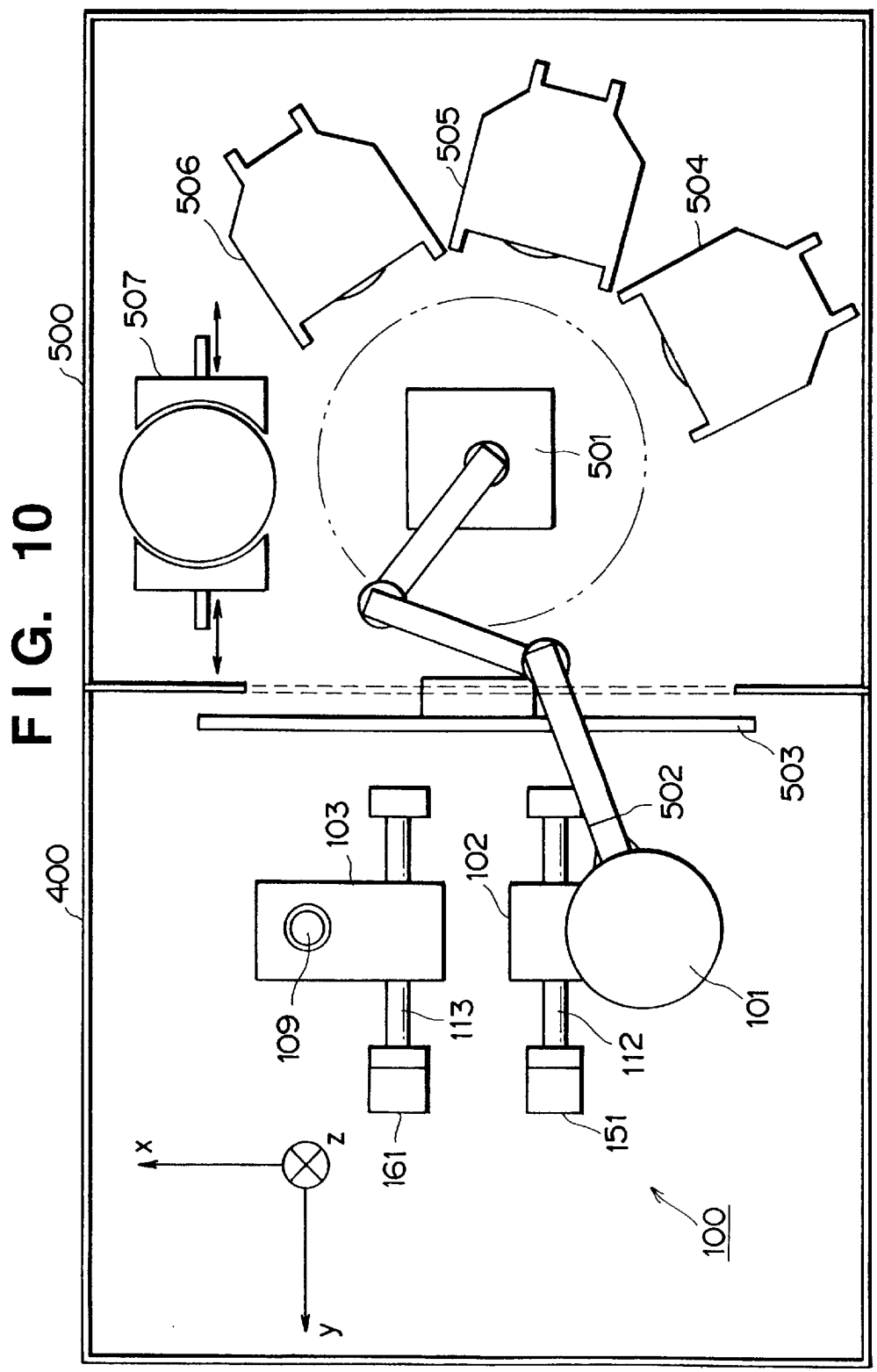
FIG. 10 is a schematic view showing the second arrangement of an automatic separating apparatus.
Figure 11:
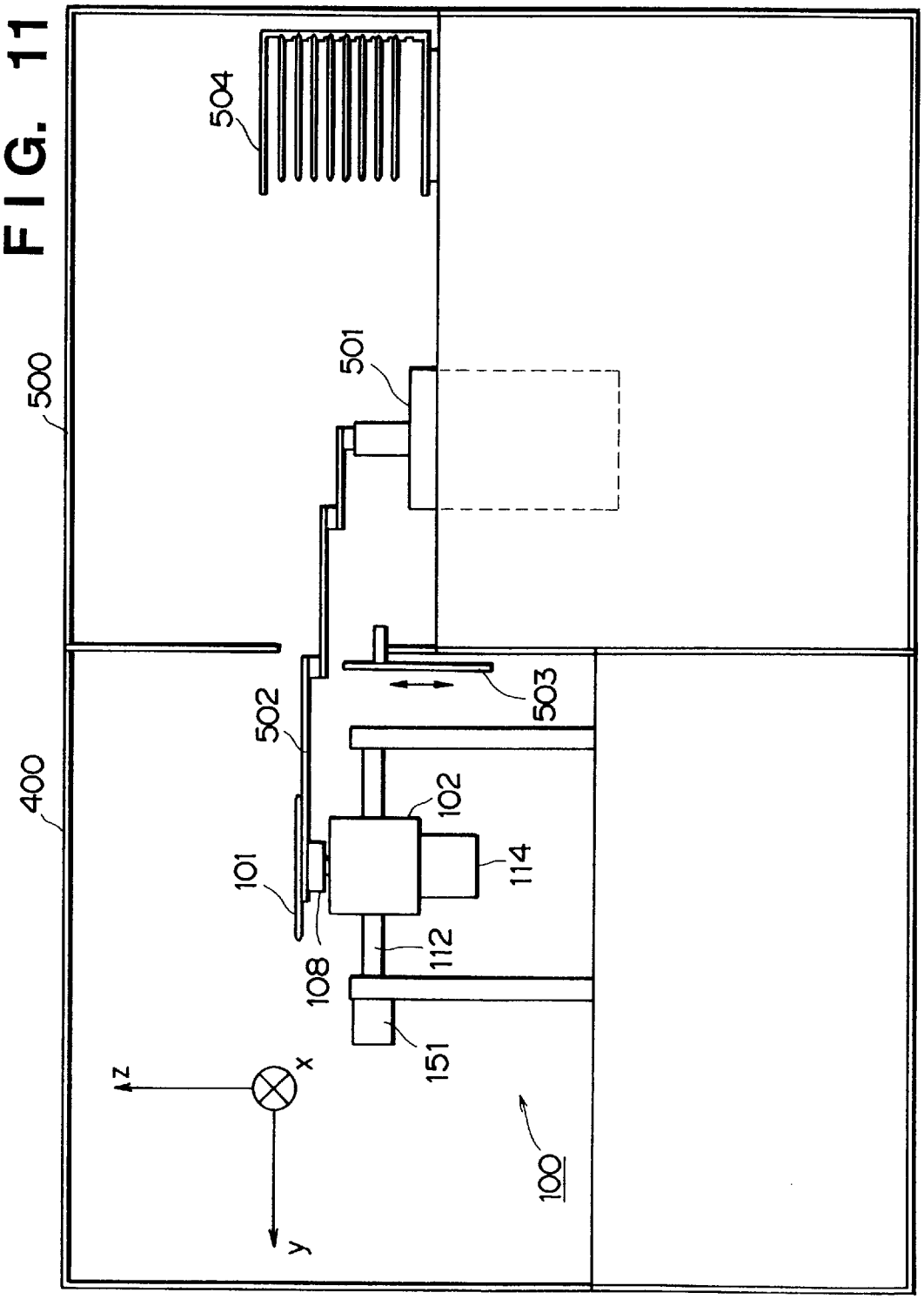
FIG. 11 is a schematic view showing the second arrangement of the automatic separating apparatus.
Figure 12:
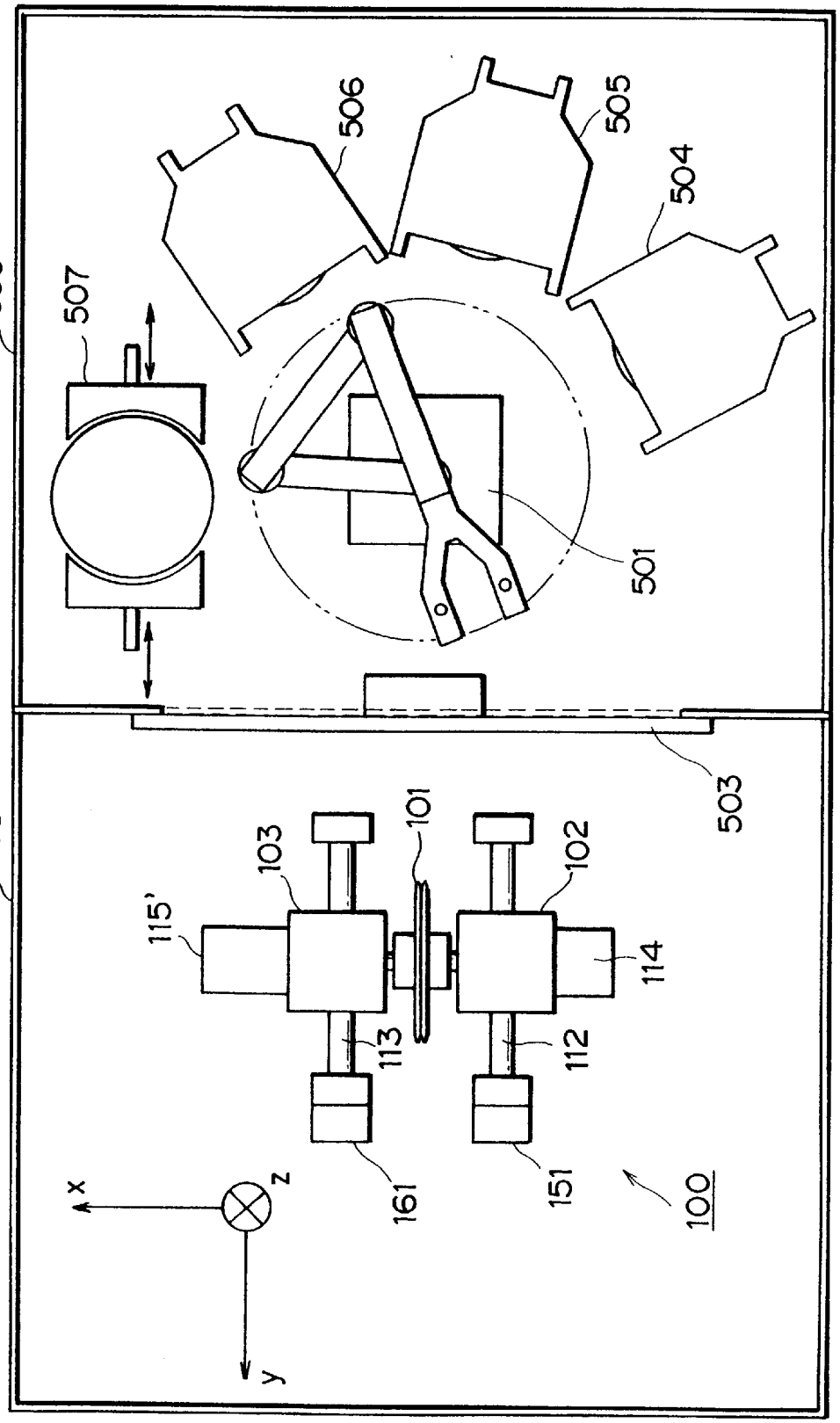
FIG. 12 is a schematic view showing the second arrangement of the automatic separating apparatus.
Figure 13:
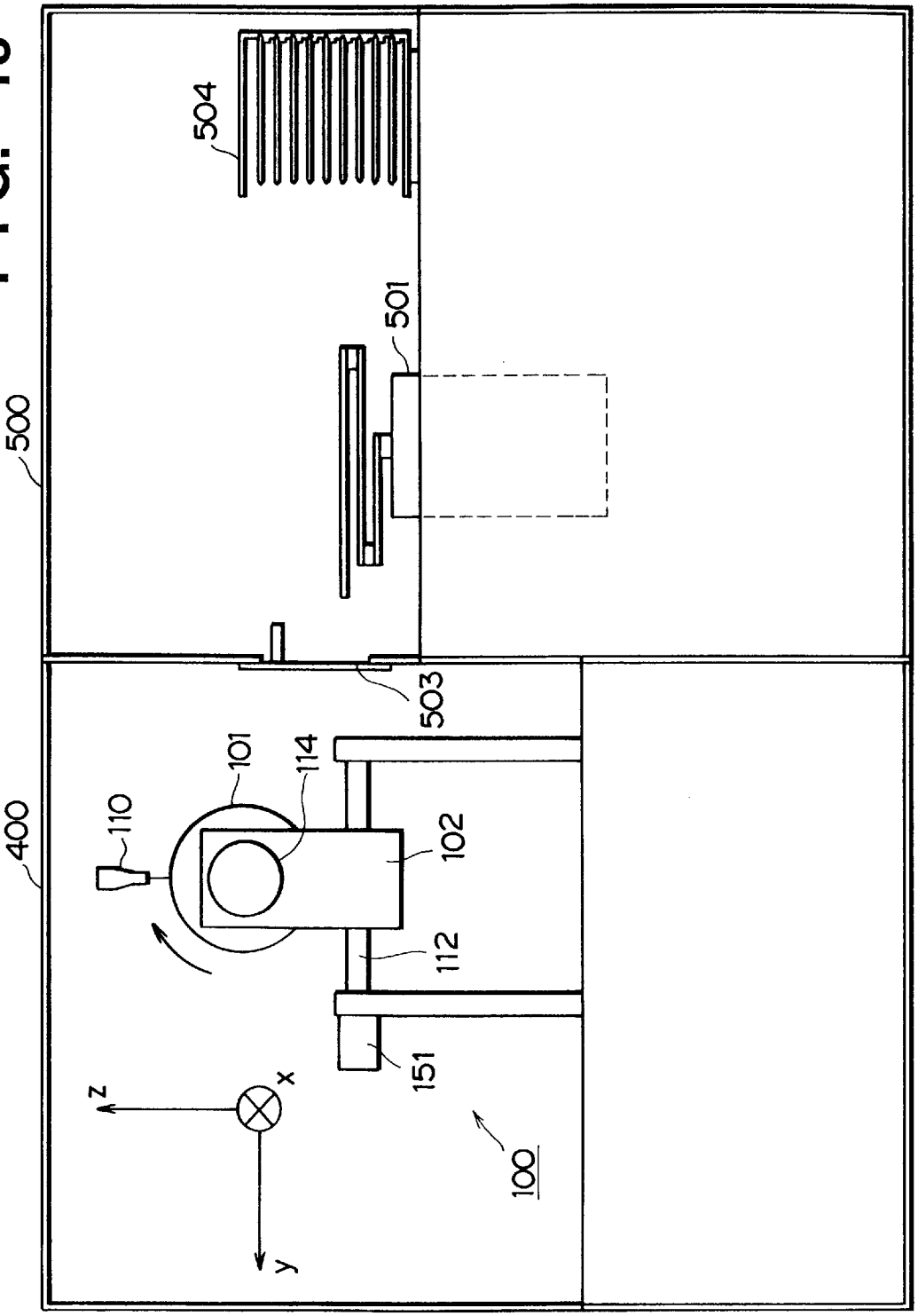
FIG. 13 is a schematic view showing the second arrangement of the automatic separating apparatus.

FIGS. 10 to 13 are schematic views showing the second arrangement of the automatic separating apparatus. More specifically, FIG. 10 is a plan view schematically showing a state wherein the bonded substrate stack 101 is set in the separating apparatus 100, FIG. 11 is a view of the arrangement shown in FIG. 10 when viewed from one side, FIG. 12 is a plan view schematically showing a state wherein the bonded substrate stack is to be separated, and FIG. 13 is a view of the arrangement shown in FIG. 12 when viewed from one side.

The automatic separating apparatus of this embodiment comprises the separating apparatus 100 of the first arrangement, and a transfer apparatus 500 for transferring a bonded substrate stack and separated substrates.

Preferably, the separating apparatus 100 is set in a chamber 400, and a shutter 503 is arranged between the chamber 400 and transfer apparatus 500. Preferably, the shutter 503 is opened when the bonded substrate stack 101 is to be set in the separating apparatus 100 or separated substrates are to be extracted, and closed during separation processing. With this arrangement, a jet medium (e.g., water) can be prevented from scattering from the chamber 400 during separation processing.

The transfer apparatus 500 comprises a transfer robot 501 for transferring the bonded substrate stack 101 and separated substrates, and a positioning unit 507 for positioning the bonded substrate stack 101 with respect to a substrate holding portion 108.

To execute separation processing, a cassette 504 storing one or a plurality of bonded substrate stacks 101 and empty cassettes 505 and 506 for storing separated substrates 101a and 101c are set at predetermined positions in the transfer apparatus 500. The cassette 504 is set such that the bonded substrate stacks are held horizontally and the opening portion faces the transfer robot 501. The cassettes 505 and 506 are set such that the separated substrates can be stored in the horizontal state and their opening portions face the transfer robot 501.

The procedure of separation processing by the automatic separating apparatus will be described below.

The operator sets the cassette 504 storing the bonded substrate stacks 101 and the empty cassettes 505 and 506 at predetermined positions in the transfer apparatus 500. When the operator instructs to start separation processing through a control panel (not shown), the automatic separating apparatus starts the following series of processing operations.

First, the separating apparatus 100 pivots substrate manipulation portions 150 and 160 to make the substrate support surfaces horizontal, as shown in FIGS. 10 and 11.

The transfer robot 501 inserts a robot hand 502 having a chuck mechanism under a corresponding bonded substrate stack 101 in the cassette 504, chucks the lower surface of the bonded substrate stack, and removes the bonded substrate stack 101.

The transfer robot 501 mounts the chucked bonded substrate stack 101 on the support table of the positioning unit 507 and cancel chuck. The positioning unit 507 aligns the central position of the bonded substrate stack 101 to the reference position by two guide members opposing each other. The transfer robot 501 chucks the lower surface of the bonded substrate stack 101 on the support table of the positioning unit 507, extends the robot hand 502 toward the substrate holding portion 108 of the separating apparatus 100, and sets the bonded substrate stack 101 at a predetermined position on the substrate holding portion 108. By using the positioning unit 507, the bonded substrate stack 101 can be positioned with respect to the substrate holding portion 108.

When the transfer robot 501 is to set the bonded substrate stack 101 on the substrate holding portion 108, the shutter 503 is open.

Each bonded substrate stack 101 can be set at a correct position on the substrate holding portion 108 by positioning each bonded substrate stack 101 by the positioning unit 507. Since the center of the bonded substrate stack 101 can be matched with the central axis of a rotary shaft 106, the distance between an ejection nozzle 110 and the side surface of the bonded substrate stack 101 is kept unchanged while the bonded substrate stack 101 is rotated and separated. Hence, the jet can be made to uniformly act along the entire circumference of the bonded substrate stack 101.

When setting of the bonded substrate stack 101 on the substrate holding portion 108 is complete, the transfer robot 501 retracts the robot hand 502, and then, the shutter 503 is closed.

In the separating apparatus 100, the substrate manipulation portions 150 and 160 are pivoted by driving sources 151 and 161 to make the bonded substrate stack 101 vertical, respectively, and the bonded substrate stack 101 is sandwiched and vacuum-chucked by the substrate holding portions 108 and 109.

The separating apparatus 100 executes separation processing. More specifically, in the separating apparatus 100, the bonded substrate stack 101 is rotated by driving sources 114 and 115', and simultaneously, a jet is ejected and injected from the ejection nozzle 110 into the separation region (porous region 101b) of the bonded substrate stack 101. With this separation processing, the bonded substrate stack 101 is separated into the two substrates 101a and 101c. The driving source 115' includes not only the above-described driving source 115 but also the adjustment mechanism shown in FIG. 8 or 9.

When the bonded substrate stack 101 is separated into the two substrates 101a and 101c, the separating apparatus 100 separates the two substrates 101a and 101c by the above-described adjustment mechanism. After this, the substrate manipulation portions 150 and 160 are pivoted by the driving sources 151 and 161 to make the substrate support surfaces of the substrate holding portions 108 and 109 horizontal, respectively.

By rotating the substrate holding portions 108 and 109 at the driving sources 114 and 115' at a high speed, the jet medium sticking to the separated substrates is removed (spin drying).

Subsequently, the shutter 503 is opened. The transfer robot 501 extends the robot hand 502 under the substrate 101c on the substrate holding portion 108, holding the substrate 101c by chucking its lower surface, and stores the substrate 101c in the cassette 505. In the same way, the transfer robot 501 extends the robot hand 502 under the substrate 101a on the substrate holding portion 109, holds the substrate 101a by chucking its lower surface, and stores the substrate 101a in the cassette 506.

With the above processing, separation processing of one bonded substrate stack is ended. This automatic separating apparatus can separate all bonded substrate stacks in the cassette 504 by repeating the above processing for all unprocessed bonded substrate stacks.

According to this automatic separating apparatus, when the cassette storing bonded substrate stacks and two empty cassettes are prepared and set in the transfer apparatus 500, and execution of separation processing is instructed, separation processing is automatically executed, and two substrates which are separated and dried are selectively stored in the two restoration cassettes.

As described above, even when separation processing is automatically executed, the arrangement capable of transferring substrates between the transfer apparatus and separating apparatus in the horizontal state has a remarkable advantage.

This advantage is easy to understand in comparison with an arrangement for transferring substrates between the transfer apparatus and separating apparatus in the vertical state. In this case, the substrate holding portion can hardly reliably chuck the bonded substrate stack unless the transfer robot transfers the substrate to the substrate holding portion while accurately holding it vertically, and the bonded substrate stack may sometimes drop. This also applies to reception of separated substrates by the transfer robot. If the substrate holding surface of the robot hand is not accurately parallel to the substrate, the robot hand can hardly reliably chuck the substrate.

Application Example of Separating Apparatus

As an application example of the above separating apparatus, a method of manufacturing an SOI substrate will be described below with reference to FIGS. 1A to 1E.

As a single-crystal Si substrate 11, a p- or n-type (100) single-crystal Si substrate having a thickness of 625 [$\mu$m], a diameter of 5 [inch], and a resistivity of 0.01 [$\omega$·cm] was prepared. This single-crystal Si substrate 11 was dipped in an HF solution and anodized to form a porous Si layer 12 having a thickness of 12 [$\mu$m] (FIG. 1A). The anodizing conditions are as follows.

Current density: 7 [mA/cm$^2$]
Anodizing solution: HF:H$_2$O:C$_2$H$_5$OH = 1:1:1
Process time: 11 [min]

This substrate was heated to 400 [° C.] in an oxygen atmosphere and oxidized for 1 hr. With this process, inner walls of pores in the porous Si layer 12 were covered with thermal oxide films. Subsequently, a single-crystal Si layer 13 having a thickness of 0.3 $\mu$m was epitaxially grown on the porous Si layer 12 by CVD. The epitaxial growth conditions are as follows. Before this process, the substrate may be baked in a hydrogen atmosphere in the epitaxial furnace.

Source gas: SiH$_4$
Carrier gas: H$_2$
Temperature: 850 [° C.]
Pressure: 1 × 10$^{-2}$ [Torr]
Growth rate: 3.3 [nm/sec]

A 0.2-$\mu$m thick SiO$_2$ layer 15 was formed on the single-crystal Si layer (epitaxial Si layer) 13 (FIG. 1B) A single-crystal Si substrate 20 was separately prepared. The surface of the SiO$_2$ layer 15 and single-crystal Si substrate 20 were brought into contact with each other at room temperature. After this, a heat treatment was performed at a temperature of 1,100 [° C.] for 1 hr to bond the two substrates (FIG. 1C).

This bonded substrate stack was stored in the cassette 504 and set in the transfer apparatus 500 of the automatic separating apparatus of the second arrangement, and separation processing was executed (FIG. 1D). As a jet medium, pure water was used. The jet diameter was set to be 0.2 [mm], and the pressure of water to be ejected was set to be 350 [Kgf/cm$^2$]. Separation processing was performed while fixing the position of the ejection nozzle immediately above the bonding interface. The bonded substrate stack was rotated at a speed of about 8 [rpm].

Most bonded substrate stacks are completely separated when they have made about five revolutions. However, in consideration of variations between substrates, the automatic separating apparatus was set to inject the jet while rotating the bonded substrate stack for about 2 min.

Even after the bonded substrate stack was separated into two substrates, the two substrates were still in contact with each other due to the action of the spring 111. After a predetermined time had elapsed from the start of bonded substrate stack separation processing, one substrate holding portion 109 retreated to the shaft support portion 103 side to spatially separate the two substrates which had been physically separated. The substrates had no flaws, cracks, or damages.

The substrate (10"+20) separated and stored in the cassette 505 was removed, and the porous Si layer on the surface was selectively etched using an HF/H$_2$O$_2$/H$_2$O-based etchant. Since the etching rate for single-crystal Si was very low, the etching amount of the single-crystal Si substrate as the underlying layer of the porous Si layer could be neglected for practical use. With this etching process, an SOI substrate having the about 0.2-μm thick single-crystal Si layer 13 on the $SiO_2$ film 15 could be formed (FIG. 1E).

It was confirmed that the surface of the resultant SOI substrate, i.e., the surface of the single-crystal Si layer 13 had no defects. Observation of the section of the single-crystal Si layer 13 with a transmission electron microscope revealed that crystal defects and the like did not increase in the process after epitaxial growth, and satisfactory crystallinity was maintained.

Instead of forming an $SiO_2$ film on the surface on the single-crystal Si layer (epitaxial layer) 13 side, even when 1) an $SiO_2$ film was formed not on the surface on the single-crystal Si layer 13 side but on the side of an independently prepared single-crystal Si substrate, or 2) $SiO_2$ films were formed both on the surface on the single-crystal Si layer 13 side and on the side of a separately prepared single-crystal Si substrate, a satisfactory SOI substrate could be formed.

The substrate (single-crystal Si substrate 11) on which the porous Si layer was formed could be used as the first or second substrate again by removing the porous Si layer on the surface and planarizing the surface.

The substrate separating apparatus and method suitable to manufacture an SOI substrate have been described above as the preferred embodiments of the present invention. The separating apparatus and method of the present invention can also be used to separate or cut any other member. The member to be separated preferably as a fragile separation region such as a porous layer.

According to the present invention, for example, risks of drop of a member such as a substrate can be decreased.

The present invention is not limited to the above embodiments and various changes and modifications can be made within the spirit and scope of the present invention. Therefore, to apprise the public of the scope of the present invention, the following claims are made.

What is claimed is:

1. A separating apparatus for separating a member, comprising:
   a manipulator arranged to change a direction of a major surface of the member; and
   a separator arranged to separate the member using a stream of a fluid, wherein said manipulator has a function of manipulating the member to match the direction of the major surface with a first direction and a function of manipulating the member to match the direction of the major surface with a second direction substantially perpendicular to the first direction.

2. The apparatus according to claim 1, wherein said manipulator receives the member with the major surface whose direction matches with the first direction, matches the direction of the major surface with the second direction, and moves the member to a position where said separator can process the member, and also matches a direction of a major surface of at least one member of the members separated by said separator with the first direction.

3. The apparatus according to claim 1, wherein said manipulator receives the member with the major surface whose direction matches with the first direction, matches the direction of the major surface with the second direction, and moves the member to a position where said separator can process the member, and also matches directions of major surfaces of the members separated by said separator with the first direction.

4. The apparatus according to claim 1, wherein the first direction is a direction in which the major surface of the member is substantially horizontal.

5. The apparatus according to claim 1, wherein the member to be processed comprises a plate member, and said separator cuts the plate member in a direction of plane to separate the member into two plate members.

6. The apparatus according to claim 5, wherein the second direction is a direction in which the major surface of the plate member is substantially vertical, and said separator ejects the fluid toward the plate member in the vertical direction to separate the plate member into two plate members.

7. The apparatus according to claim 6, wherein the first direction is a direction in which the major surface of the plate member is substantially horizontal.

8. The apparatus according to claim 5, wherein said manipulator comprises a pair of holding means for holding the plate member by sandwiching the member from two surface sides when said separator separates the plate member.

9. The apparatus according to claim 8, further comprising rotation means for rotating at least one of said pair of holding means about a shaft perpendicular to a holding surface.

10. The apparatus according to claim 9, wherein said rotation means rotates said holding means when said separator separates the member.

11. The apparatus according to claim 9, wherein said separator separates the member using a stream of a liquid, and said rotation means rotates said holding means to remove the liquid sticking to the member held by said holding means after the member is separated by said separator.

12. The apparatus according to claim 8, wherein each of said holding means comprises chuck means for chucking the plate member.

13. The apparatus according to claim 12, wherein said manipulator comprises pivot means for pivoting at least one of said pair of holding means about a shaft parallel to a chuck surface of said chuck means, and the direction of the major surface of the plate member is changed by said pivot means.

14. The apparatus according to claim 13, wherein the shaft as a pivot center of said holding means is arranged at a position where said pair of holding means do not interfere with each other.

15. The apparatus according to claim 12, wherein said manipulator comprises pivot means for pivoting said pair of holding means about shafts parallel to chuck surfaces of chuck means, and the direction of the major surface of the plate member is changed by said pivot means.

16. The apparatus according to claim 1, further comprising rotation means for rotating the member about a shaft perpendicular to the major surface.

17. The apparatus according to claim 16, wherein said rotation means comprises means for rotating the member when said separator separates the member.

18. The apparatus according to claim 16, wherein said separator separates the member using a stream of liquid, and said rotation means comprises means for rotating at least one of the members separated by said separator to remove the liquid sticking to the member.

19. The apparatus according to claim 1, further comprising a chamber for covering said apparatus.

20. The apparatus according to claim 19, wherein said chamber has a shutter capable of opening/closing.

21. The apparatus according to claim 20, further comprising transfer means for transferring the member to be processed to said manipulator and receiving the separated member from said manipulator, said transfer means being arranged outside said chamber and transferring/receiving the member to/from said manipulator while opening said shutter.

22. The apparatus according to claim 21, further comprising positioning means for positioning the member to be processed with respect to said manipulator.

23. The apparatus according to claim 20, wherein said shutter is closed at least when the member is separated by said separator.

24. The apparatus according to claim 1, wherein the member to be separated has a fragile layer as a separation layer, and the fragile layer is substantially parallel to the major surface of the member.

25. A separating method of separating a member, comprising:
a reception step of receiving the member with a major surface whose direction matches with a first direction;
a manipulation step of matching the direction of the major surface of the member with a second direction substantially perpendicular to the first direction; and
a separation step of separating the member using a stream of a fluid.

26. The method according to claim 25, further comprising the second manipulation step of matching a direction of a major surface of at least one member of the members separated in the separation step with the first direction.

27. The method according to claim 25, further comprising the second manipulation step of matching directions of major surfaces of the members separated in the separation step with the first direction.

28. The method according to claim 25, wherein the first direction is a direction in which the major surface of the member is substantially horizontal.

29. The method according to claim 25, wherein the member to be processed comprises a plate member, and the separation step comprises cutting the plate member in a direction of plane to separate the member into two plate members.

30. The method according to claim 29, wherein the second direction is a direction in which the major surface of the plate member is substantially vertical, and the separation step comprises ejecting the fluid toward the plate member in the vertical direction to separate the plate member into two plate members.

31. The method according to claim 30, wherein the first direction is a direction in which the major surface of the plate member is substantially horizontal.

32. The method according to claim 29, wherein the separation step comprises holding the plate member by sandwiching the member from two surface sides.

33. The method according to claim 25, wherein the separation step comprises separating the member using the stream of a fluid while rotating the member to be processed about a shaft perpendicular to the major surface.

34. The method according to claim 25, wherein the separation step comprises separating the member using a liquid, and the method further comprises rotating at least one of the members separated to remove the liquid sticking to the member after the member is separated in the separation step.

35. The method according to claim 25, wherein the separation step is executed in a chamber to prevent the fluid from scattering.

36. The method according to claim 25, wherein the member to be processed has a fragile layer as a separation layer, and the fragile layer is substantially parallel to the major surface of the member.

37. The method according to claim 36, wherein the fragile layer comprises a porous layer.

38. The method according to claim 37, wherein the member to be processed is prepared by bonding a first substrate sequentially having a nonporous layer and a porous layer inward from a surface to a second substrate via the nonporous layer.

39. The method according to claim 38, wherein the nonporous layer has a single-crystal silicon layer.

40. The method according to claim 39, wherein the nonporous layer has an insulated layer on the single-crystal silicon layer.

41. The method according to claim 40, wherein the insulating layer is formed from a silicon oxide.

42. The method according to claim 38, wherein the second substrate comprises an insulating substrate.

43. The method according to claim 38, wherein the second substrate comprises a transparent substrate.

44. The method according to claim 38, wherein the second substrate comprises a quartz substrate.

45. The method according to claim 38, wherein the porous layer is formed by anodizing a single-crystal silicon substrate.

46. The method according to claim 36, wherein the fragile layer comprises a layer having microcavity.

47. The method according to claim 46, wherein the member to be processed is prepared by bonding a second substrate to a surface of a first substrate incorporating a microcavity layer.

48. The method according to claim 47, wherein the microcavity layer is formed by implanting ions into a single-crystal silicon substrate.

49. The method according to claim 36, wherein the member to be processed is prepared by bonding at least two plate members, and at least one of the two plate members comprises a semiconductor substrate.

50. The method according to claim 49, wherein the semiconductor substrate comprises a single-crystal silicon substrate.

51. The method according to claim 36, wherein the member to be processed is prepared by bonding at least two plate members, and at least one of the two plate members comprises an insulating substrate.

52. The method according to claim 51, wherein the insulating substrate comprises a quartz substrate.

53. The method according to claim 36, wherein the member to be processed is prepared by bonding at least two plate members, and at least one of the two plate members comprises a transparent substrate.

54. The method according to claim 25, wherein water is used as the fluid.

55. A semiconductor substrate manufacturing method comprising the steps of:
preparing a first substrate incorporating a porous layer or a microcavity layer;
bonding the first substrate to a second substrate to prepare a bonded substrate stack;
separating the bonded substrate stack into a first substrate side and a second substrate side using the porous layer or microcavity layer as a separation region by using the separating method of claim 34; and
removing the porous layer or microcavity layer remaining on the second substrate side.

56. The method according to claim 55, further comprising the step of, after the bonded substrate stack is separated, removing the porous layer or microcavity layer remaining on the first substrate side to reuse the first substrate.

57. The method according to claim 55, wherein the porous layer is formed by anodizing a semiconductor substrate.

58. The method according to claim 55, wherein the microcavity layer is formed by implanting ions in a semiconductor substrate.

59. A separating apparatus for separating a member, comprising:

a manipulator arranged to change a direction of a major surface of the member; and a separator arranged to separate the member utilizing a pressure of a fluid, wherein said manipulator has a function of manipulating the member to match the direction of the major surface with a first direction and a function of manipulating the member to match the direction of the major surface with a second direction substantially perpendicular to the first direction.

60. A separating method of separating a member comprising:

a reception step of receiving the member with a major surface whose direction matches with a first direction;

a manipulation step of matching the direction of the major surface of the member with a second direction substantially perpendicular to the first direction; and a separation step of separating the member utilizing pressure of a fluid.

61. A semiconductor processing apparatus comprising:

a chamber;

a separator located in said chamber and arranged to separate a member utilizing pressure of a fluid, wherein said member has a major surface;

a shutter provided to said chamber; and a robot arranged to set the member to said separator, wherein said robot sets the member to said separator while said shutter is opened and while said major surface is oriented in a first direction, and then said separator separates the member while said shutter is closed and while said major surface is oriented in a second direction substantially perpendicular to said first direction.

62. The apparatus according to claim 61, wherein said robot is further arranged to set the member to said separator after the member is positioned to a predetermined position.

63. A method for manufacturing a semiconductor element, the method comprising:

supporting a member in a horizontal state by a transfer robot;

opening a shutter provided to a chamber;

setting the member to a separating apparatus located in the chamber by the transfer robot;

closing the shutter;

orienting said member in a vertical state; and separating the member utilizing pressure of a fluid by the separating apparatus.

64. The method according to claim 63 further comprising a step of positioning the member to a predetermined position before the setting step.

65. A semiconductor processing apparatus comprising:

a chamber;

a separator located in said chamber and arranged to separate a member utilizing pressure of a fluid, said separator having first and second holding mechanisms for holding the member by sandwiching the member and said first holding mechanism having a rotation mechanism for rotating the member;

a shutter provided to said chamber; and a robot arranged to set the member to said separator, wherein said robot sets the member to said separator while said shutter is opened and then said separator separates the member while said shutter is closed.

66. The apparatus according to claim 65, wherein said second holding mechanism has a rotation mechanism and said rotation mechanisms of said first and second holding mechanisms rotate the member in synchronism with each other.

67. A method for manufacturing a semiconductor element, the method comprising the steps of:

supporting a member in a horizontal state by a transfer robot;

opening a shutter provided to a chamber;

setting the member to a separating apparatus located in the chamber by the transfer robot;

closing the shutter; and separating the member utilizing pressure of a fluid by the separating apparatus which has first and second holding mechanisms for holding the member by sandwiching the member, the first holding mechanism having a rotation mechanism for rotating the member.

68. The method according to claim 67, wherein the second holding mechanism has a rotation mechanism and the rotation mechanisms of the first and second holding mechanisms rotate the member in synchronism with each other.

69. A separating apparatus for separating a member including at least a first substrate bonded to a second substrate, comprising:

A manipulator arranged to change a direction of a major surface of the member; and A separator arranged to separate the first and second substrates from each other, such that the bonded substrates are coextensive and are separated into portions having substantially equal dimensions, wherein said manipulator has a function of manipulating the member to match the direction of the major surface with a first direction and a function of manipulating the member to match the direction of the major surface with a second direction substantially perpendicular to the first direction.

70. A separating method for separating a member including at least a first substrate bonded to a second substrate, comprising:

A reception step of receiving the member with a major surface whose direction matches with a first direction;

A manipulation step of matching the direction of the major surface of the member with a second direction substantially perpendicular to the first direction; and A separation step of separating the first and second substrates from each other, wherein the bonded substrates are coextensive and are separated into portions having substantially equal dimentions.

71. A semiconductor substrate manufacturing method comprising the steps of:

preparing a first substrate incorporating a porous layer or a microcavity layer;

bonding the first substrate to a second substrate to prepare a bonded substrate stack;

separating the bonded substrate stack into a first substrate side and a second substrate side using the porous layer or microcavity layer as a separation region by using the separating method comprising:

a reception step of receiving the member with a major surface whose direction matches with a first direction, a manipulation step of matching the direction of the major surface of the member with a second direction substantially perpendicular to the first direction, and a separation step of separating the member; and removing the porous layer or microcavity layer remaining on the second side.

* * * * *

UNITED STATES PATENT AND TRADEMARK OFFICE
CERTIFICATE OF CORRECTION

PATENT NO.      : 6,540,861 B2
DATED           : April 1, 2003
INVENTOR(S)     : Kiyofumi Sakaguchi et al.

It is certified that error appears in the above-identified patent and that said Letters Patent is hereby corrected as shown below:

Column 8,
Line 6, please add -- for example into layers having substantially equal dimensions -- after "12"

Column 16,
Line 3, please delete "[ω cm]" and insert therefore -- [Ω·cm] --

Signed and Sealed this

Twentieth Day of July, 2004

JON W. DUDAS
*Acting Director of the United States Patent and Trademark Office*